United States Patent
Dickerson et al.

(10) Patent No.: US 9,917,149 B1
(45) Date of Patent: Mar. 13, 2018

(54) DIODE AND METHOD OF MAKING THE SAME

(71) Applicant: National Technology & Engineering Solutions of Sandia LLC, Albuquerque, NM (US)

(72) Inventors: Jeramy Ray Dickerson, Albuquerque, NM (US); Jonathan Wierer, Jr., Coopersburg, PA (US); Robert Kaplar, Albuquerque, NM (US); Andrew A. Allerman, Tijeras, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 15/166,783

(22) Filed: May 27, 2016

(51) Int. Cl.
*H01L 29/06* (2006.01)
*H01L 29/66* (2006.01)
*H01L 29/20* (2006.01)
*H01L 29/866* (2006.01)
*H01L 21/265* (2006.01)

(52) U.S. Cl.
CPC ...... *H01L 29/0615* (2013.01); *H01L 21/2654* (2013.01); *H01L 29/2003* (2013.01); *H01L 29/66113* (2013.01); *H01L 29/866* (2013.01)

(58) Field of Classification Search
None
See application file for complete search history.

(56) References Cited

U.S. PATENT DOCUMENTS

| | | | |
|---|---|---|---|
| 2007/0170436 A1* | 7/2007 | Sugawara | H01L 29/0615 257/77 |
| 2013/0161633 A1* | 6/2013 | Nie | H01L 29/66204 257/76 |
| 2013/0161634 A1* | 6/2013 | Disney | H01L 29/0619 257/76 |
| 2013/0161780 A1* | 6/2013 | Kizilyalli | H01L 29/868 257/488 |
| 2014/0175450 A1* | 6/2014 | Disney | H01L 29/0615 257/76 |

OTHER PUBLICATIONS

Dickerson, J.R. et al., "Vertical GaN Power Diodes With a Bilayer Edge Termination", IEEE Transactions on Electron Devices, vol. 63, No. 1, Jan. 2016.

* cited by examiner

*Primary Examiner* — Eric Ward
(74) *Attorney, Agent, or Firm* — Martin I. Finston; Aman Talwar; Wendy Koba

(57) ABSTRACT

A diode includes a second semiconductor layer over a first semiconductor layer. The diode further includes a third semiconductor layer over the second semiconductor layer, where the third semiconductor layer includes a first semiconductor element over the second semiconductor layer. The third semiconductor layer additionally includes a second semiconductor element over the second semiconductor layer, wherein the second semiconductor element surrounds the first semiconductor element. Further, the third semiconductor layer includes a third semiconductor element over the second semiconductor element. Furthermore, a hole concentration of the second semiconductor element is less than a hole concentration of the first semiconductor element.

20 Claims, 4 Drawing Sheets

DIODE AND METHOD OF MAKING THE SAME

STATEMENT OF GOVERNMENT INTEREST

This invention was made with Government support under contract no. DE-AC04-94AL85000 awarded by the U.S. Department of Energy to Sandia Corporation. The Government has certain rights in the invention.

BACKGROUND

Various types of electrical components are used in a variety of electrical devices. Very often, some of these electrical components are configured to handle currents only in one direction. Applying voltage in a direction which is opposite of what these electrical components are configured to handle can lead to malfunction of these electrical components and/or the electrical devices which include them. This can also lead to hazardous conditions such as a risk of fire and/or an explosion. In order to prevent the above hazards and/or malfunction, diodes are often used to ensure that a voltage drop results in an intended direction. Applying a voltage in a direction which is opposite the intended direction will lead to a suppression of the resultant current if a diode is appropriately incorporated into a circuit. However, most diodes have an intrinsic threshold known as the reverse breakdown voltage which acts as a limitation to the above suppression. In other words, a voltage in a direction which is opposite the intended direction that surpasses the reverse breakdown voltage will lead to a failure of the diode, thereby resulting in the diode conducting a current which is opposite to the intended direction.

SUMMARY

One aspect of the present description relates to a diode including a second semiconductor layer over a first semiconductor layer. The diode further includes a third semiconductor layer over the second semiconductor layer, where the third semiconductor layer includes a first semiconductor element over the second semiconductor layer. The third semiconductor layer additionally includes a second semiconductor element over the second semiconductor layer, wherein the second semiconductor element surrounds the first semiconductor element. Further, the third semiconductor layer includes a third semiconductor element over the second semiconductor element. Furthermore, a hole concentration of the second semiconductor element is less than a hole concentration of the first semiconductor element.

Another aspect of the present description relates to a diode including a second semiconductor layer over a first semiconductor layer. Additionally, the diode includes a third semiconductor layer over the second semiconductor layer, where the third semiconductor layer includes a first semiconductor element over the second semiconductor layer. Additionally, the third semiconductor layer includes a second semiconductor element over the second semiconductor layer, wherein the second semiconductor element surrounds the first semiconductor element. Further, the third semiconductor layer includes a third semiconductor element over the second semiconductor element. Furthermore, a hole concentration of the second semiconductor element is less than a hole concentration of the first semiconductor element. The diode additionally includes a first conductive layer over the first semiconductor element.

Still another aspect of the present disclosure relates to a method of making a diode, where the method includes forming a first GaN layer over a substrate, where the first GaN layer includes an n-type dopant. The method further includes forming a second GaN layer over the first GaN layer, where the second GaN layer comprises a p-type dopant. Additionally, the method includes implanting a portion of the second GaN layer with a substance, wherein the substance includes Nitrogen.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry, various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the present application. Specific examples of components and arrangements are described below to simplify the present disclosure. These are examples and are not intended to be limiting. The making and using of illustrative embodiments are discussed in detail below. It should be appreciated, however, that the disclosure provides many applicable concepts that can be embodied in a wide variety of specific contexts. In at least some embodiments, one or more embodiment(s) detailed herein and/or variations thereof are combinable with one or more embodiment(s) herein and/or variations thereof.

By spreading an electrical field formed during reverse voltage over a larger surface area within a semiconductor diode in one or more embodiments, a threshold voltage for the reverse breakdown can be increased. Various embodiments of the present disclosure relate to a junction termination extension (JTE) created via ion implantation for a GaN power diode. The JTE is formed outside the ohmic contact on the p-type side of the GaN power diode, in one or more embodiments. In various embodiments, the JTE spreads the electric field and thereby increases the reverse voltage where avalanche breakdown occurs. According to one or more embodiments, the ion implantation is performed into the top p-type GaN layers and forms in a bilayer which includes a non-conductive (or compensated) layer at a surface and a low hole concentration layer at a bottom of the p-type GaN layer. The JTE is terminated in a horizontal direction by either in some embodiments a selective higher energy implant or by a combination of a shallow etch into the p-type GaN layers and the JTE implant, in other embodiments.

Figure 1:
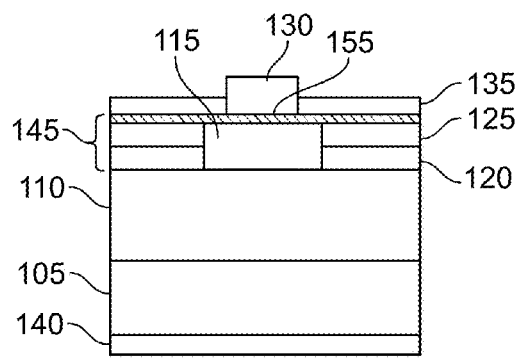
FIG. 1 is a cross-sectional view of a diode in accordance with one or more embodiments.

FIG. 1 is a cross-sectional view of a diode 100 in accordance with one or more embodiments. Diode 100 includes a first semiconductor layer 105 over a second conductive layer 140. A second semiconductor layer 110 is over first semiconductor layer 105. A third semiconductor layer 145 is over second semiconductor layer 110. Third semiconductor layer 145 includes a first semiconductor element 115, a second semiconductor element 120, and a third semiconductor element 125. First semiconductor element 115 is between second semiconductor element 120 and third semiconductor element 125. Third semiconductor element 125 is over second semiconductor element 120. A contact layer 155 is over first semiconductor element 115, in some embodiments. A first conductive layer 130 is over first semiconductor element 115. A passivation layer 135 is over second semiconductor element 120.

First semiconductor layer 105 includes a substrate. In at least one embodiment, first semiconductor layer 105 includes Gallium Nitride (GaN). In some embodiments, first semiconductor layer 105 includes $Al_xGa_{1-x}N$ for $0<=x<=1$. In one or more embodiments, first semiconductor layer 105 is n-doped. In at least one embodiment, first semiconductor layer 105 includes at least one of Silicon (Si), Oxygen (O), or Tin (Sn). A concentration of Si is greater than or equal to approximately $10^{16}$ $cm^{-3}$ in first semiconductor layer 105, in one or more embodiments. In one or more embodiments, first semiconductor layer 105 has an electron concentration of approximately $2\times10^{18}$ $cm^{-3}$. First semiconductor layer 105 includes Boron Nitride, Boron Aluminum Nitride, Boron Gallium Nitride, Aluminum Nitride, Indium Nitride, Aluminum Gallium Nitride, Indium Gallium Nitride, or Nitrogen, according to one or more embodiments. In some embodiments, first semiconductor layer 105 includes Gallium Arsenide Nitride, Aluminum Gallium Arsenide Nitride, Indium Gallium Arsenide Nitride, Indium Aluminum Arsenide Nitride, Gallium Arsenide Antimonide Nitride, Sapphire, Silicon Carbide, Silicon, or Gallium Indium Nitride Arsenide Antimonide. In at least one embodiment, first semiconductor layer 105 has a thickness of approximately 400 μm.

Second semiconductor layer 110 is over first semiconductor layer 105. In operation, second semiconductor layer 110 supports a vertical component of an electric field when diode 100 is operated under reverse bias. In at least one embodiment, second semiconductor layer 110 includes Gallium Nitride (GaN). In some embodiments, second semiconductor layer 110 includes $Al_xGa_{1-x}N$ for $0<=x<=1$. In one or more embodiments, second semiconductor layer 110 is n-doped. In at least one embodiment, second semiconductor layer 110 includes at least one of Silicon (Si), Oxygen (O), or Tin (Sn). An electron concentration is less than or equal to approximately $10^{16}$ $cm^{-3}$ in second semiconductor layer 110, in one or more embodiments. In at least one embodiment, second semiconductor layer 110 has an electron concentration of approximately $5\times10^{15}$ $cm^{-3}$. Second semiconductor layer 110 includes Boron Nitride, Boron Aluminum Nitride, Boron Gallium Nitride, Aluminum Nitride, Indium Nitride, Aluminum Gallium Nitride, Indium Gallium Nitride, or Nitrogen, according to one or more embodiments. In some embodiments, second semiconductor layer 110 includes Gallium Arsenide Nitride, Aluminum Gallium Arsenide Nitride, Indium Gallium Arsenide Nitride, Indium Aluminum Arsenide Nitride, Gallium Arsenide Antimonide Nitride, Sapphire, Silicon Carbide, Silicon, or Gallium Indium Nitride Arsenide Antimonide. In at least one embodiment, second semiconductor layer 105 has a thickness greater than or equal to approximately 3 μm. In one or more embodiments, second semiconductor layer 105 has a thickness of approximately 40 μm. In some embodiments, a thickness of second semiconductor layer 110 varies by as much as approximately 20% above or below that value.

Third semiconductor layer 145 is over second semiconductor layer 110. Third semiconductor layer 145 includes first semiconductor element 115, second semiconductor element 120, and third semiconductor element 125. In at least one embodiment, at least one of second semiconductor element 120 or third semiconductor element 125 is a junction termination extension (JTE). First semiconductor element 115 is over second semiconductor layer 110. In operation, first semiconductor element 115 is configured to include carriers. In at least one embodiment, the carriers include holes. In at least one embodiment, first semiconductor element 115 includes Gallium Nitride (GaN). In some embodiments, first semiconductor element 115 includes $Al_xGa_{1-x}N$ for $0<=x<=1$. In one or more embodiments, first semiconductor element 115 is p-doped. In at least one embodiment, first semiconductor element 115 includes Mg. A concentration of Mg is approximately $2\times10^{19}$ $cm^{-3}$ in the first semiconductor element 115, in one or more embodiments. First semiconductor element 115 includes Boron Nitride, Boron Aluminum Nitride, Boron Gallium Nitride, Aluminum Nitride, Indium Nitride, Aluminum Gallium Nitride, Indium Gallium Nitride, or Nitrogen, according to one or more embodiments. In some embodiments, first semiconductor element 115 includes Gallium Arsenide Nitride, Aluminum Gallium Arsenide Nitride, Indium Gallium Arsenide Nitride, Indium Aluminum Arsenide Nitride, Gallium Arsenide Antimonide Nitride, Sapphire, Silicon Carbide, Silicon, or Gallium Indium Nitride Arsenide Antimonide. In at least one embodiment, first semiconductor element 115 has a thickness ranging from approximately 400 nm to approximately 500 nm. In some embodiments, first semiconductor element 115 has a thickness less than or equal to approximately 400 nm. In some embodiments, a thickness of second semiconductor layer 110 varies by as much as approximately 20% above or below that value.

Contact layer 155 is over first semiconductor element 115, according to at least one embodiment. Contact layer 155 has a thickness of 12.5 nm, according to one or more embodiments. In some embodiments, contact layer 155 has a Mg dopant concentration of greater than or equal to approximately $2\times10^{19}$ $cm^{-3}$. In at least one embodiment, contact layer 155 is a heavily doped GaN layer. In operation, contact layer 155 facilitates ohmic contact between first semiconductor element 115 and first conductive layer 130, according to some embodiments.

Second semiconductor element 120 is over second semiconductor layer 110. When diode 100 is operated under reverse bias, second semiconductor element 120 spreads an electric field thereby resulting in an increase of a reverse voltage threshold where avalanche breakdown occurs, according to one or more embodiments. Second semiconductor element 120 includes GaN, according to one or more embodiments. In some embodiments, second semiconductor element 120 includes $Al_xGa_{1-x}N$ for $0<=x<=1$. In some embodiments, second semiconductor element 120 includes Silicon (Si) or Nitrogen (N). In at least one embodiment, a thickness of second semiconductor element 120 is less than or equal to 250 nm. In one or more embodiments, a thickness of second semiconductor element 120 is approximately 26 nm. In at least one embodiment, second semiconductor element 120 has a Mg dopant concentration of approximately 10% or less of the Mg dopant concentration of first semiconductor element 115. Second semiconductor element 120 includes vacancies created by ion implantation, according to at least one embodiment. In operation, these vacancies compensate for the grown in ionized acceptors (e.g. Mg), in one or more embodiments. In at least one embodiment, second semiconductor element 120 has a vacancy concentration ranging from approximately $10^{16}$ to approximately $10^{19}$ cm$^{-3}$. Such vacancies do not completely compensate holes in second semiconductor element 120, according to at least one embodiment. In some embodiments, second semiconductor element 120 has vacancies greater than or equal to approximately $10^{19}$ cm$^3$. Such vacancies fully compensate holes in second semiconductor element 120, according to at least embodiment. Second semiconductor element 120 is placed between approximately 1 μm and approximately 5 μm from an edge of first conductive layer 130, according to some embodiments. Second semiconductor element 120 includes Boron Nitride, Boron Aluminum Nitride, Boron Gallium Nitride, Aluminum Nitride, Indium Nitride, Aluminum Gallium Nitride, Indium Gallium Nitride, or Nitrogen, according to one or more embodiments. In some embodiments, second semiconductor element 120 includes Gallium Arsenide Nitride, Aluminum Gallium Arsenide Nitride, Indium Gallium Arsenide Nitride, Indium Aluminum Arsenide Nitride, Gallium Arsenide Antimonide Nitride, Sapphire, Silicon Carbide, Silicon, or Gallium Indium Nitride Arsenide Antimonide. In some embodiments, a thickness of second semiconductor element 120 varies by as much as approximately 20% above or below that value. According to one or more embodiments, second semiconductor element 120 has a hole concentration less than a hole concentration of first semiconductor element 115. In at least one embodiment, a width of a side of second semiconductor element 120 is approximately 50 μm.

Third semiconductor element 125 is over second semiconductor element 120. Third semiconductor element 125 includes GaN, according to one or more embodiments. In some embodiments, third semiconductor element 125 includes $Al_xGa_{1-x}N$ for $0<=x<=1$. In at least one embodiment, a thickness of third semiconductor element 125 is greater than or equal to 150 nm. In at least one embodiment, third semiconductor element 125 has a Mg dopant concentration of approximately 10% or less of the Mg dopant concentration of first semiconductor element 115. Third semiconductor element 125 includes vacancies created by ion implantation, according to at least one embodiment. In one or more embodiments, third semiconductor element 125 includes Nitrogen. In operation, these vacancies compensate for the in-grown ionized acceptors (e.g. Mg), in one or more embodiments. In at least one embodiment, third semiconductor element 125 has vacancies ranging from approximately $10^{16}$ to approximately $10^{19}$ cm$^{-3}$. Such vacancies do not completely compensate holes in third semiconductor element 125, according to at least one embodiment. In some embodiments, third semiconductor element 125 has vacancies greater than or equal to approximately $10^{19}$ cm$^{-3}$. Such vacancies fully compensate holes in third semiconductor element 125, according to at least one embodiment. In some embodiments, third semiconductor element 125 includes Si. In at least one embodiment, vacancies in third semiconductor material 125 compensate for approximately 90% of holes. Third semiconductor element 125 is displaced at a distance ranging from approximately 1 μm to approximately 5 μm from an edge of first conductive layer 130, according to some embodiments. Third semiconductor element 125 includes Boron Nitride, Boron Aluminum Nitride, Boron Gallium Nitride, Aluminum Nitride, Indium Nitride, Aluminum Gallium Nitride, Indium Gallium Nitride, or Nitrogen, according to one or more embodiments. In some embodiments, third semiconductor element 125 includes Gallium Arsenide Nitride, Aluminum Gallium Arsenide Nitride, Indium Gallium Arsenide Nitride, Indium Aluminum Arsenide Nitride, Gallium Arsenide Antimonide Nitride, Sapphire, Silicon Carbide, Silicon, or Gallium Indium Nitride Arsenide Antimonide. In some embodiments, a thickness of third semiconductor element 125 varies by up to approximately 20% around the region. In at least one embodiment, a width of a side of third semiconductor element 125 is approximately 50 μm.

Passivation layer 135 is over third semiconductor element 125. Passivation layer 135 is a dielectric material which provides insulation to diode 100, according to one or more embodiments. Passivation material 135 includes $SiN_x$, $Al_2O_3$, AlN, BN, $SiO_2$, $HfO_2$, HFSiOx, HFSiON, $ZrO_2$, or $La_2O_3$, according to some embodiments. In at least one embodiment, passivation material 135 includes SiN. In one or more embodiments, passivation layer 135 has a thickness of approximately 500 nm. In some embodiments, a thickness of passivation semiconductor element 135 varies by as much as approximately 20% above or below that value.

First conductive layer 130 is over first semiconductor element 115. In operation, first conductive layer 130 provides ohmic contact with first semiconductor element 115, according to some embodiments. First conductive layer 130 is a metal layer, according to at least one embodiment. In some embodiments, first conductive layer 130 includes at least one of Al, Au, Co, Fe, Cr, Mn, Pd, Nb, Ru, Ta, Ni, Ti, V, W, Zr, TaN, or TiN. In at least one embodiment, first conductive layer 130 includes a Pd/Au layer which forms an ohmic contact with first semiconductor element 115. The Pd/Au layer has a diameter of approximately 150 μm, according to one or more embodiments. According to at least one embodiment, first conductive layer 130 includes an Au layer. In some embodiments, the Au layer has a diameter of approximately 154 μm. In some embodiments, the Au layer has a thickness of approximately 1 μm. In at least one embodiment, first conductive layer includes a Ti/Al/Ti/Ni/Au metal stack. According to one or more embodiments, first conductive layer 130 is p-doped.

Second conductive layer 140 is under first semiconductor layer 105. In operation, second conductive layer 140 provides ohmic contact with first semiconductor layer 105. Second conductive layer 140 is a metal layer, according to at least one embodiment. In some embodiments, second conductive layer 140 includes at least one of Al, Au, Pd, Co, Fe, Cr, Mn, Nb, Ru, Ta, Ni, Ti, V, W, Zr, TaN, or TiN. In at least one embodiment, second conductive layer includes a Ti/Al/Ti/Ni/Au metal stack. In some embodiments, second conductive layer 140 includes a Pd/Au layer which forms an ohmic contact with first semiconductor layer 105. According to one or more embodiments, second conductive layer 130 is n-doped.

Figure 2:
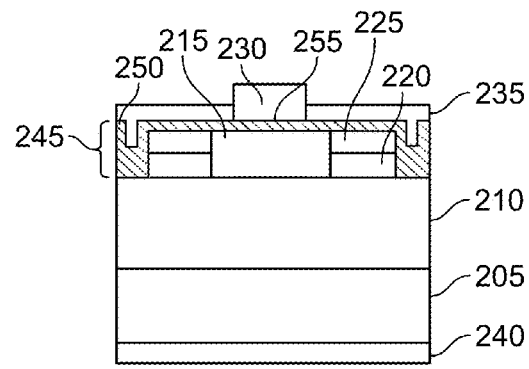
FIG. 2 is a cross-sectional view of a diode in accordance with at least one embodiment.

FIG. 2 is a cross-sectional view of a diode 200 in accordance with one or more embodiments. Diode 200 is similar to diode 100 (FIG. 1). Diode 200 includes a first semiconductor layer 205 over a second conductive layer 240. A second semiconductor layer 210 is over first semiconductor layer 205. A third semiconductor layer 245 is over second semiconductor layer 210. Third semiconductor layer 245 includes a first semiconductor element 215, a second semiconductor element 220, and a third semiconductor element 225. In at least one embodiment, second semiconductor element 220 and third semiconductor element 225 is a junction termination extension (JTE). First semiconductor element 215 is between second semiconductor element 220 and third semiconductor element 225. Third semiconductor element 225 is over second semiconductor element 220. A contact layer 255 is over first semiconductor element 215, in some embodiments. A first conductive layer 230 is over first semiconductor element 215. A passivation layer 235 is over second semiconductor element 220. Unlike FIG. 1, diode 200 includes a trench 250 at an edge of third semiconductor layer 245. In at least one embodiment, an entirety of trench 250 has vacancies greater than or equal to approximately $10^{19}$ cm$^{-3}$. In some embodiments, a depth of trench 250 is approximately 150 nm. A width of trench 250 is approximately 5 μm, according to one or more embodiments.

Figure 3:
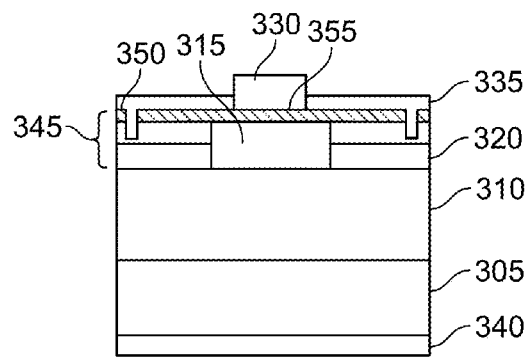
FIG. 3 is a cross-sectional view of a diode in accordance with at least one embodiment.

FIG. 3 is a cross-sectional view of a diode 300 in accordance with one or more embodiments. Diode 300 is similar to diode 200 (FIG. 2). Diode 300 includes a first semiconductor layer 305 over a second conductive layer 340. A second semiconductor layer 310 is over first semiconductor layer 305. A third semiconductor layer 345 is over second semiconductor layer 310. Third semiconductor layer 345 includes a first semiconductor element 315 and a second semiconductor element 320. A contact layer 355 is over first semiconductor element 315, in some embodiments. A first conductive layer 330 is over first semiconductor element 315. A passivation layer 335 is over second semiconductor element 320. An edge of third semiconductor layer 345 includes a trench 350. In at least one embodiment, an entirety of trench 350 has vacancies greater than or equal to approximately $10^{19}$ cm$^{-3}$. In some embodiments, a depth of trench 350 is approximately 150 nm. A width of trench 350 is approximately 5 μm, according to one or more embodiments. In comparison with FIG. 2, second semiconductor element 320 of diode 300 is similar to third semiconductor element 225 (FIG. 2), according to one or more embodiments. In at least one embodiment, second semiconductor element 320 is similar to second semiconductor element 220 (FIG. 2).

Figure 4:
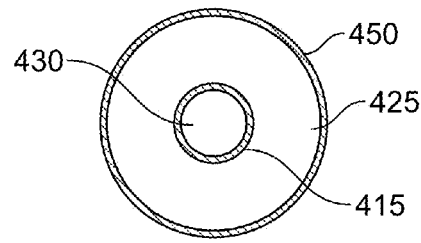
FIG. 4 is a top-view of a cross-section of a diode in accordance with one or more embodiments.

FIG. 4 is a top-view of a cross-section of a diode 400 in accordance with one or more embodiments. Diode 400 is similar to diode 200 (FIG. 2). The top-view of a cross-section of diode 400 includes a trench 450 surrounding a third semiconductor element 425. Third semiconductor element 425 surrounds a first semiconductor element 415. A first conductive layer 430 is over first semiconductor element 415.

Figure 5:
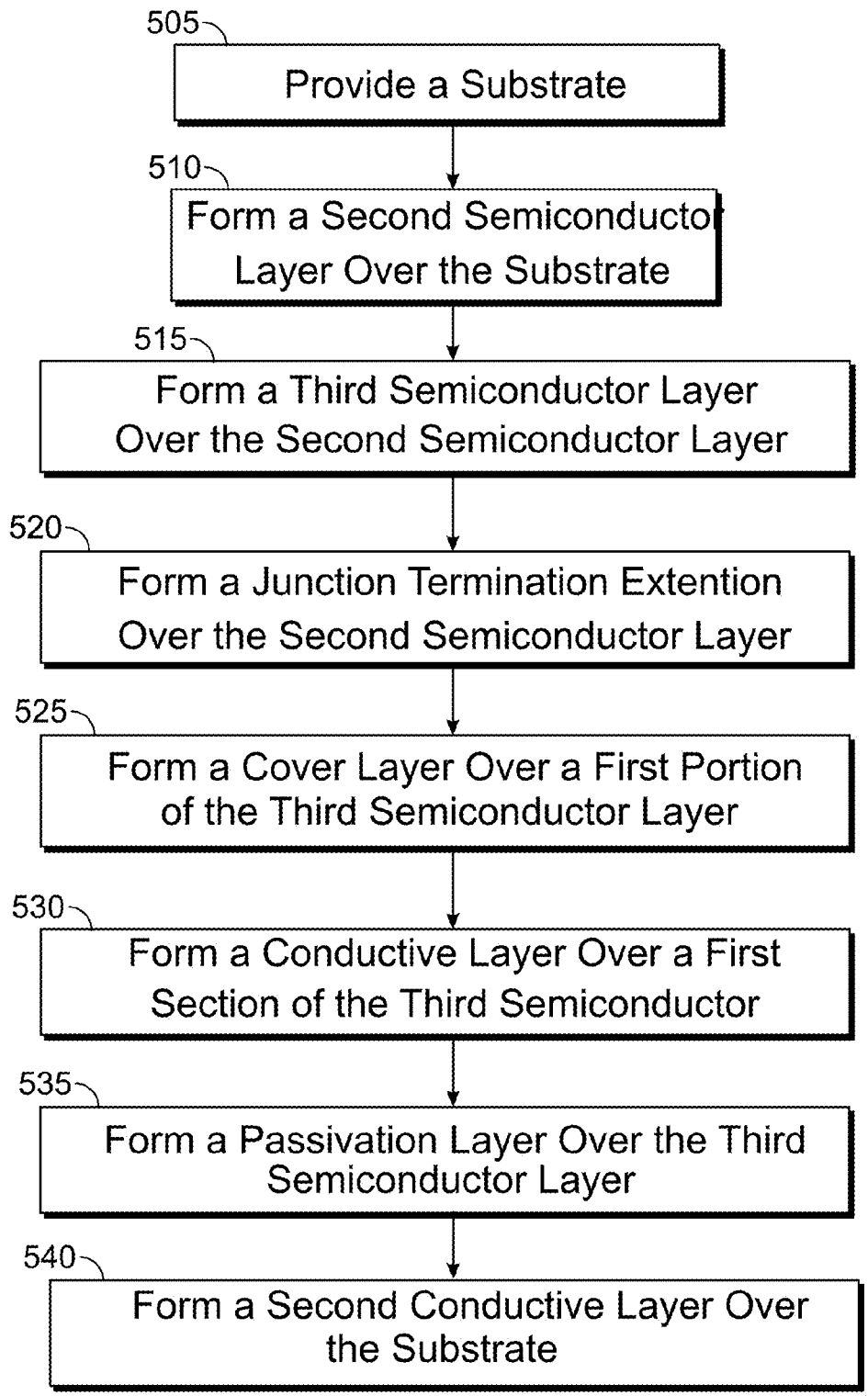
FIG. 5 is a flow chart of a method of making a diode in accordance with one or more embodiments.

FIG. 5 is a flow chart of a method of making a photodetector in accordance with one or more embodiments. Method 500 begins with operation 505 in which a substrate is provided. In at least one embodiment, the substrate, e.g., first semiconductor layer 205 (FIG. 2), is formed using a metalorganic chemical vapor deposition (MOCVD) process. In some embodiments, the substrate is formed using molecular beam epitaxy (MBE), hydride vapor phase epitaxy (HVPE), or other suitable formation method. The MOCVD process includes introducing precursors into a process environment and providing conditions which promote a reaction between appropriate atoms in the precursors to form a layer. In at least one embodiment, the substrate is n-GaN. In at least one embodiment, precursors such as Trimethylgallium (TMG or TMGa) or Triethylgallium (TEG or TEGa) is used a source of Gallium. The flow rate(s) of precursor(s) which provide Gallium as a source ranges from approximately 10 μmol/min to approximately 1000 μmol/min, according to some embodiments. In at least one embodiment, precursors such as Ammonia (NH$_3$), Phenyl hydrazine, Dimethylhydrazine (DMHy), or Tertiarybutylamine (TBAm) is used as a source of Nitrogen. The flow rate(s) of precursor(s) which provide Nitrogen as a source ranges from approximately 0.002 mol/min to approximately 3 mol/min, according to some embodiments. In at least one embodiment, precursors such as Silane (SiH$_4$) or Disilane (Si$_2$H$_6$) is used a source of Silicon. The flow rate(s) of precursor(s) which provide Silicon as a source ranges from approximately 0.005 nmol/min to approximately 11 nmol/min, according to some embodiments. In some embodiments, Si is substituted with Oxygen (O) or Tin (Sn) to provide impurity for GaN. In some embodiments, precursor(s) which provide Silicon is substituted with precursor which provides Oxygen (O) (i.e. N$_2$O) or precursor which provides Tin (Sn) (i.e. Triethyltin). In some embodiments, the process environment temperature ranges from approximately 950° C. to approximately 1140° C. The process environment pressure ranges from approximately 10 torr to approximately 1000 torr, according to some embodiments. In one or more embodiments, Si is implanted into the substrate. In at least one embodiment, the substrate is n-doped. Applicable to some embodiments, a disclosure titled "Preparation of Large Freestanding GaN Substrates by Hydride Vapor Phase Epitaxy Using GaAs as a Starting Substrate[1]" is hereby incorporated by reference.

[1] Author list: Kensaku Motoki, Takuji Okahisa, Naoki Matsumoto, Masato Matsushima, Hiroya Kimura, Hitoshi Kasai, Kikurou Takemoto, Koji Uematsu, Tetsuya Hirano, Masahiro Nakayama, Seiji Nakahata, Masaki Ueno, Daijirou Hara, Yoshinao Kumagai, Akinori Koukitu, and Hisashi Seki. Available at http://dx.doi.org/10.1143/jjap.40.1140. Accessed on Nov. 9, 2015.

The substrate includes Boron Nitride, Boron Aluminum Nitride, Boron Gallium Nitride, Aluminum Nitride, Indium Nitride, Aluminum Gallium Nitride, Indium Gallium Nitride, Sapphire, Silicon Carbide, Silicon, or Nitrogen, according to one or more embodiments. In some embodiments, the substrate includes Gallium Arsenide Nitride, Aluminum Gallium Arsenide Nitride, Indium Gallium Arsenide Nitride, Indium Aluminum Arsenide Nitride, Gallium Arsenide Antimonide Nitride, or Gallium Indium Nitride Arsenide Antimonide.

In operation 510, a second semiconductor layer is formed over the substrate. In at least one embodiment, the substrate, e.g., second semiconductor layer 215 (FIG. 2), is formed using a metalorganic chemical vapor deposition (MOCVD) process. In some embodiments, the substrate is formed using molecular beam epitaxy (MBE), hydride vapor phase epitaxy (HVPE), or other suitable formation method. The MOCVD process includes introducing precursors into a process environment around the substrate and providing conditions which promote a reaction between appropriate atoms in the precursors to form the second semiconductor layer over the substrate. In at least one embodiment, the second semiconductor layer is n-GaN. In at least one embodiment, precursors such as Trimethylgallium (TMG or TMGa) or Triethylgallium (TEG or TEGa) is used a source of Gallium. The flow rate(s) of precursor(s) which provide Gallium as a source ranges from approximately 10 μmol/min to approximately 1000 μmol/min, according to some embodiments. In at least one embodiment, precursors such as Ammonia (NH$_3$), Phenyl hydrazine, Dimethylhydrazine (DMHy), or Tertiarybutylamine (TBAm) is used as a source of Nitrogen. The flow rate(s) of precursor(s) which provide Nitrogen as a source ranges from approximately 0.002 mol/min to approximately 3 mol/min, according to some embodiments. In at least one embodiment, precursors such as Silane ($SiH_4$) or Disilane ($Si_2H_6$) is used a source of Silicon. The flow rate(s) of precursor(s) which provide Silicon as a source ranges from approximately 0.005 nmol/min to approximately 11 nmol/min, according to some embodiments. In some embodiments, Si is substituted with Oxygen (O) and/or Tin (Sn) as dopants for GaN. In some embodiments, precursor(s) which provide Silicon is substituted with precursor which provides Oxygen (O) (i.e. $N_2O$) or precursor which provides Tin (Sn) (i.e. Triethyltin). In some embodiments, the process environment temperature ranges from approximately 950° C. to approximately 1140° C. The process environment pressure ranges from approximately 10 torr to approximately 1000 torr, according to some embodiments. In one or more embodiments, Si is implanted into the substrate. In at least one embodiment, the second semiconductor layer is n-doped.

The second semiconductor layer includes Boron Nitride, Boron Aluminum Nitride, Boron Gallium Nitride, Aluminum Nitride, Indium Nitride, Aluminum Gallium Nitride, Indium Gallium Nitride, or Nitrogen, according to one or more embodiments. In some embodiments, the second semiconductor layer includes Gallium Arsenide Nitride, Aluminum Gallium Arsenide Nitride, Indium Gallium Arsenide Nitride, Indium Aluminum Arsenide Nitride, Gallium Arsenide Antimonide Nitride, Sapphire, Silicon Carbide, Silicon, or Gallium Indium Nitride Arsenide Antimonide.

In operation 515, a third semiconductor layer is formed over the second semiconductor layer. In at least one embodiment, the third semiconductor layer, e.g., third semiconductor layer 245 (FIG. 2), is formed using a metalorganic chemical vapor deposition (MOCVD) process. In some embodiments, the substrate is formed using molecular beam epitaxy (MBE), hydride vapor phase epitaxy (HVPE), or other suitable formation method. In at least one embodiment, the second semiconductor layer is p-GaN. In at least one embodiment, precursors such as Trimethylgallium (TMG or TMGa) or Triethylgallium (TEG or TEGa) is used a source of Gallium. The flow rate(s) of precursor(s) which provide Gallium as a source ranges from approximately 10 μmol/min to approximately 1000 μmol/min, according to some embodiments. In at least one embodiment, precursors such as Ammonia ($NH_3$), Phenyl hydrazine, Dimethylhydrazine (DMHy), or Tertiarybutylamine (TBAm) is used a source of Nitrogen. The flow rate(s) of precursor(s) which provide Nitrogen as a source ranges from approximately 0.002 mol/min to approximately 3 mol/min, according to some embodiments. In at least one embodiment, precursors such as Magnesocene ($Mg(C_5H_5)_2$) is used a source of Magnesium. The flow rate(s) of precursor(s) which provide Magnesium as a source ranges from approximately 10 μmol/min to approximately 500 μmol/min, according to some embodiments. In some embodiments, the process environment temperature ranges from approximately 650° C. to approximately 1050° C. The process environment pressure ranges from approximately 10 torr to approximately 1000 torr, according to some embodiments. In at least one embodiment, the third semiconductor layer is p-doped.

The third semiconductor layer includes Boron Nitride, Boron Aluminum Nitride, Boron Gallium Nitride, Aluminum Nitride, Indium Nitride, Aluminum Gallium Nitride, Indium Gallium Nitride, or Nitrogen, according to one or more embodiments. In some embodiments, the third semiconductor layer includes Gallium Arsenide Nitride, Aluminum Gallium Arsenide Nitride, Indium Gallium Arsenide Nitride, Indium Aluminum Arsenide Nitride, Gallium Arsenide Antimonide Nitride, Sapphire, Silicon Carbide, Silicon, or Gallium Indium Nitride Arsenide Antimonide.

In operation 520, a junction termination extension is formed over the second semiconductor layer. In at least one embodiment, the junction termination extension, e.g., second semiconductor element 220 and third semiconductor element 225 (FIG. 2), is formed using an ion implantation process. In at least one embodiment, a portion of the third semiconductor layer, e.g., third semiconductor layer 245 (FIG. 2), is masked before implementing the ion implantation process. In one or more embodiments, the junction termination extension includes at least one of Nitrogen (N), Hydrogen (H), or Silicon (Si). The ion implantation includes three nitrogen implant energies and doses, according to one or more embodiments. In at least one embodiment, a first dose, a second dose and a third dose are 30 keV/$3\times10^{12}$ $cm^{-2}$, 80 keV/$3\times10^{12}$ $cm^{-2}$, and 130 keV/$3\times10^{12}$ $cm^{-2}$, respectively. In one or more embodiments, a first dose, a second dose and a third dose are 30 keV/$3\times10^{12}$ $cm^{-2}$, 110 keV/$3\times10^{12}$ $cm^{-2}$, and 240 keV/$3\times10^{12}$ $cm^{-2}$, respectively.

In some embodiments, the junction termination extension, e.g., second semiconductor element 220 and third semiconductor element 225 (FIG. 2), is formed by dry etching portions of the third semiconductor layer. In at least one embodiment, the junction termination extension is formed using metalorganic chemical vapor deposition (MOCVD) process. In some embodiments, the junction termination extension is formed using molecular beam epitaxy (MBE), hydride vapor phase epitaxy (HVPE), or other suitable formation method. In at least one embodiment, precursors such as Trimethylgallium (TMG or TMGa) or Triethylgallium (TEG or TEGa) is used a source of Gallium. The flow rate(s) of precursor(s) which provide Gallium as a source ranges from approximately 10 μmol/min to approximately 1000 μmol/min, according to some embodiments. In at least one embodiment, precursors such as Ammonia ($NH_3$), Phenyl hydrazine, Dimethylhydrazine (DMHy), or Tertiarybutylamine (TBAm) is used as a source of Nitrogen. The flow rate(s) of precursor(s) which provide Nitrogen as a source ranges from approximately 0.002 mol/min to approximately 3 mol/min, according to some embodiments. In at least one embodiment, precursors such as Silane ($SiH_4$) or Disilane ($Si_2H_6$) is used a source of Silicon. The flow rate(s) of precursor(s) which provide Silicon as a source ranges from approximately 0.005 nmol/min to approximately 11 nmol/min, according to some embodiments. In some embodiments, the process environment temperature ranges from approximately 950° C. to approximately 1140° C. The process environment pressure ranges from approximately 10 torr to approximately 1000 torr, according to some embodiments. In at least one embodiment, a flow rate of precursor which provides Silicon varies during the MOCVD process.

In an optional operation 525, a contact layer is formed over at least a first portion of the third semiconductor layer. A second portion of the third semiconductor layer is masked during operation 525, according to one or more embodiments. In at least one embodiment, the contact layer, e.g., contact layer 255 (FIG. 2), is formed using a metalorganic chemical vapor deposition (MOCVD) process. In some embodiments, the contact layer is formed using molecular beam epitaxy (MBE), hydride vapor phase epitaxy (HVPE), or other suitable formation method. In at least one embodiment, the contact layer includes Mg. In one or more embodiments, a Mg dopant concentration of the contact layer is greater than a Mg dopant concentration of first semiconductor element 215 (FIG. 1). In at least one embodiment, precursors such as Trimethylgallium (TMG or TMGa) or Triethylgallium (TEG or TEGa) is used a source of Gallium. The flow rate(s) of precursor(s) which provide Gallium as a source ranges from approximately 10 µmol/min to approximately 1000 µmol/min, according to some embodiments. In at least one embodiment, precursors such as Ammonia ($NH_3$), Phenyl hydrazine, Dimethylhydrazine (DMHy), or Tertiarybutylamine (TBAm) is used as a source of Nitrogen. The flow rate(s) of precursor(s) which provide Nitrogen as a source ranges from approximately 0.002 mol/min to approximately 3 mol/min, according to some embodiments. In at least one embodiment, precursors such as Magnesocene ($Mg(C_5H_5)_2$) is used a source of Magnesium. The flow rate(s) of precursor(s) which provide Magnesium as a source ranges from approximately 10 µmol/min to approximately 500 µmol/min, according to some embodiments. In some embodiments, the process environment temperature ranges from approximately 650° C. to approximately 1050° C. The process environment pressure ranges from approximately 10 torr to approximately 1000 torr, according to some embodiments. In at least one embodiment, the contact layer is p-doped.

In operation 530, a first conductive layer is formed over a first section of the third semiconductor layer. A second section of the third semiconductor layer is masked during operation 530, according to one or more embodiments. In at least one embodiment, the first conductive layer, e.g., conductive layer 230 (FIG. 2), is formed using a metalorganic chemical vapor deposition (MOCVD) process. In some embodiments, the first conductive layer is formed using molecular beam epitaxy (MBE), hydride vapor phase epitaxy (HVPE), Physical Vapor Deposition (PVD), Chemical Vapor Deposition (CVD), Atomic Layer Deposition (ALD), sputtering, spin-on coating or another suitable formation method. In at least one embodiment, the first conductive layer includes Mg. In one or more embodiments, forming a first conductive layer includes forming a seed layer of Pd/Au over the first section of the third semiconductor layer. In some embodiments, first conductive layer includes at least one of Al, Au, Co, Fe, Cr, Mn, Pd, Nb, Ru, Ta, Ni, Ti, V, W, Zr, TaN, or TiN. In at least one embodiment, the first conductive layer is p-doped.

In operation 535, a passivation layer is formed over the third semiconductor layer. In at least one embodiment, the passivation layer, e.g., passivation layer 235 (FIG. 2), is formed using Physical Vapor Deposition (PVD), Chemical Vapor Deposition (CVD), Atomic Layer Deposition (ALD), sputtering, spin-on coating or another suitable formation method. At least a portion of the first conductive layer is masked during operation 535, according to one or more embodiments. In some embodiments, annealing is performed after forming the passivation layer. Passivation layer includes $SiN_x$, $Al_2O_3$, $SiO_2$, $HfO_2$, HFSiON, $ZrO_2$, or $La_2O_3$, according to some embodiments.

In operation 540, a second conductive layer is formed over the substrate. In at least one embodiment, the second conductive layer is in physical contact with the substrate. In at least one embodiment, the second conductive layer, e.g., second conductive layer 240 (FIG. 2), is formed using a metalorganic chemical vapor deposition (MOCVD) process. In some embodiments, the first conductive layer is formed using molecular beam epitaxy (MBE), hydride vapor phase epitaxy (HVPE), Physical Vapor Deposition (PVD), Chemical Vapor Deposition (CVD), Atomic Layer Deposition (ALD), sputtering, spin-on coating or another suitable formation method. In at least one embodiment, the second conductive layer includes at least one of Nitrogen (N), Silicon (Si), Tin (Sn), or Oxygen (O). In some embodiments, second conductive layer 140 includes at least one of Al, Au, Pd, Co, Fe, Cr, Mn, Nb, Ru, Ta, Ni, Ti, V, W, Zr, TaN, or TiN. In at least one embodiment, second conductive layer includes a Ti/Al/Ti/Ni/Au metal stack. In at least one embodiment, the second conductive layer is n-doped.

One of ordinary skill in the art would recognize that operations are added or removed from method 500, in one or more embodiments. One of ordinary skill in the art would also recognize that an order of operations in method 500 is able to be changed, in some embodiments.

Figure 6A:
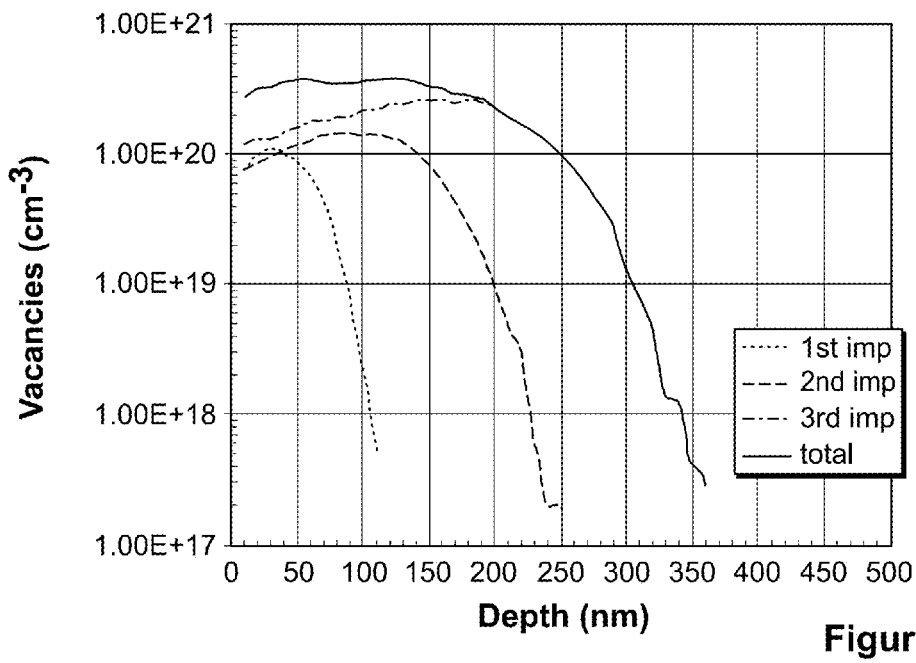
FIGS. 6a and 6b are graphs which illustrate vacancies caused by various implantation sequences as a function of depth in accordance with one or more embodiments.
Figure 6B:
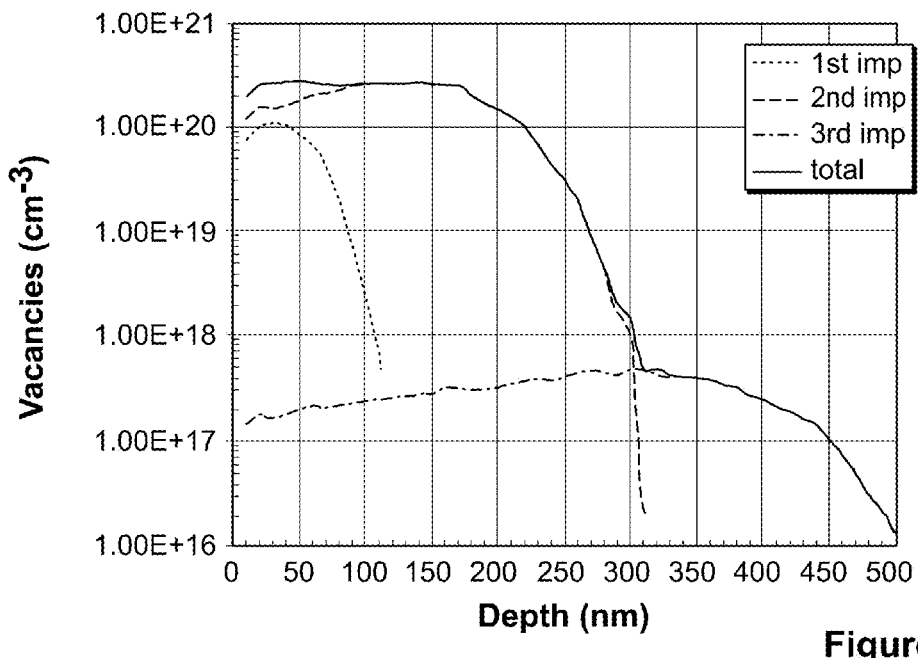

Referring to FIG. 6a, a graph illustrates vacancies as a function of depth during an implantation process, according to one or more embodiments. When implant doses of 30 keV/$3 \times 10^{12}$ $cm^{-2}$, 80 keV/$3 \times 10^{12}$ $cm^{-2}$, and 130 keV/$3 \times 10^{12}$ $cm^{-2}$ are performed over the third semiconductor layer, such an implant sequence creates a "flat top" implant at a surface of the third semiconductor layer with vacancies of approximately $4 \times 10^{20}$ $cm^{-3}$, and a tail of vacancies deeper into the third semiconductor layer. For depths ranging from the surface of the third semiconductor layer to approximately 300 nm, these vacancies fully compensate for the holes originally present in the third semiconductor layer. As a result, the third semiconductor layer at the above stated depth turns intrinsic. For depths lower than 300 nm, the third semiconductor layer results in a lower p-type doped layer with an implanted vacancy that cannot completely compensate the holes originally present in the third semiconductor layer. Referring to FIG. 6b, another graph illustrates vacancies as a function of depth during an implantation process, according to some embodiments. When implant doses of 30 keV/$3 \times 10^{12}$ $cm^{-2}$, 110 keV/$3 \times 10^{12}$ $cm^{-2}$, and 240 keV/$3 \times 10^{12}$ $cm^{-2}$ (first dose, second dose, and third dose, respectively) are performed over the third semiconductor layer, such an implant sequence creates a lower number of vacancies (i.e. approximately $3 \times 10^{17}$ $cm^{-3}$ to approximately $6 \times 10^{17}$ $cm^{-3}$) compared to the implant sequence discussed above. The implantation pattern illustrated in FIG. 6b results in the doped layer to have a lower p-type concentration for at least the reasons stated above with respect to FIG. 6a. The third dose of implant of the implant pattern illustrated in FIG. 6b is chosen to achieve an engineered hole concentration, according to one or more embodiments.

Figure 7:
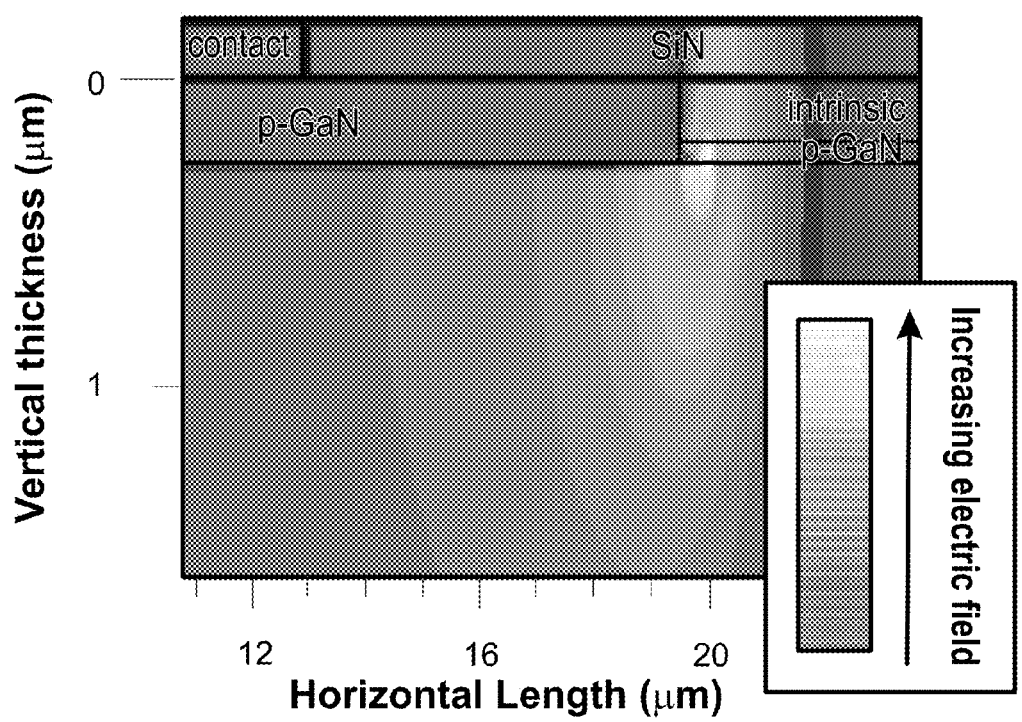
FIG. 7 illustrates an effect of an engineered hole concentration on an electric field, according to one or more embodiments.

FIG. 7 illustrates an effect of an engineered hole concentration on an electric field, according to one or more embodiments. Electric field contours, based on a numerical simulation of an illustrative embodiment, are shown near the lower right hand corner of a p-GaN element corresponding to element 120 (FIG. 1). As illustrated, a lower concentration p-type doped layer spreads the electric field in a vicinity of an interface between the third semiconductor layer and the second semiconductor layer, according to at least one embodiment. This spreading of the electric field over a larger surface area results in avalanche breakdown to occur at high reverse voltages because such dilution of the electric field lowers an intensity of the electric field. Lowering the intensity of the electric field (i.e. electric field per square area) precludes carriers from gathering enough momentum to initiate avalanche breakdown, thereby resulting in higher reverse breakdown voltages. In one or more embodiments, the above phenomenon results in reverse break down voltage to be approximately 2700 volts.

Various embodiments of the present disclosure relate to a junction termination extension (JTE) created via ion implantation for a III-V material diode. The JTE is formed outside the ohmic contact on the p-type side of the III-V material diode, in one or more embodiments. In various embodiments, the JTE spreads the electric field and thereby increases the reverse voltage where avalanche breakdown occurs. According to one or more embodiments, the ion implantation is performed into the top p-type III-V material layers and forms a bilayer which includes a non-conductive (or intrinsic) layer at a surface and a low hole concentration layer at a bottom of the p-type III-V material layer. The JTE is terminated in a horizontal direction by either, in some embodiments, a selective higher energy implant or by a combination of a shallow etch into the p-type GaN layers and the JTE implant, in other embodiments.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A power diode formed of a group III-V semiconductor material comprising:
    a first layer of semiconductor material doped to exhibit a first conductivity type;
    a first ohmic contact coupled to the first layer;
    a second layer of semiconductor material doped to exhibit the first conductivity type, disposed over the first layer, the second layer having a lower concentration of dopants than the first layer;
    an island region of semiconductor material doped to exhibit a second, opposite conductivity type, disposed over a portion of the second layer;
    a second ohmic contact coupled to the island region; and
    a junction termination extension region disposed over the second layer so as to surround the island region, wherein the junction termination extension on region comprises a bilayer structure including an upper layer disposed over a lower layer, wherein
    the lower layer is a layer of semiconductor material doped to exhibit the second conductivity type, disposed over the second layer and having a lower concentration of dopants than the island region, the lower layer conformed to spread an electrical field, created when the power diode is operated under reverse bias, away from the island region and toward an outer boundary of the power diode; and
    the upper layer is a layer of undoped semiconductor material.

2. The power diode of claim 1 wherein the power diode further comprises
    a passivation layer disposed over an exposed surface of the junction termination extension region, providing electrical isolation for the power diode.

3. The power diode of claim 2 wherein the passivation layer comprises a dielectric material.

4. The power diode of claim 2 wherein the passivation layer comprises a layer of SiN.

5. The power diode of claim 2 wherein the passivation layer has a thickness in the range of 400-600 nm.

6. The power diode of claim 1 wherein the power diode further comprises a contact region disposed between the island region and the second ohmic contact, the contact region comprising a layer of heavily-doped semiconductor material of the second conductivity type.

7. The power diode of claim 1 wherein the power diode further comprises a trench formed through at least a portion of the junction termination extension region at the outer boundary of the power diode.

8. The power diode of claim 7 wherein the trench extends through the junction termination extension region to the second layer.

9. The power diode of claim 7 wherein the trench has a width of about 5 µm.

10. The power diode of claim 1 wherein the first conductivity type comprises n-type conductivity and the second conductivity type comprises p-type conductivity.

11. The power diode of claim 10 wherein the dopants for the first and second layers comprises an element selected from the group consisting of: Si, O, and Sn, and the dopant for the island region and the lower layer comprises Mg.

12. The power diode of claim 1, wherein each of the first semiconductor layer, the second semiconductor layer, and the third semiconductor layer comprises at least one of Gallium Nitride, Boron Nitride, Boron Aluminum Nitride, Boron Gallium Nitride, Aluminum Nitride, Indium Nitride, Aluminum Gallium Nitride, Indium Gallium Nitride, Nitrogen, Gallium Arsenide Nitride, Aluminum Gallium Arsenide Nitride, Indium Gallium Arsenide Nitride, Indium Aluminum Arsenide Nitride, Gallium Arsenide Antimonide Nitride, or Gallium Indium Nitride Arsenide Antimonide.

13. The power diode of claim 1 wherein the semiconductor material is selected from the group consisting of GaN and $Al_xGa_{1-x}N$ for $0 \le x \le 1$.

14. A GaN power diode comprising:
    a first layer of n-type GaN;
    a first ohmic contact coupled to the first layer;
    a second layer of n-type GaN, the second layer having a lower concentration of dopants than the first layer;
    an island region of p-type GaN disposed over a portion of the second layer;
    a second ohmic contact coupled to the island region; and
    a junction termination extension region disposed over the second layer so as to surround the island region, wherein the junction termination extension region comprises a bilayer structure including an upper layer disposed over a lower layer, wherein
    the lower layer is a layer of p-type GaN disposed over the second layer and having a lower concentration of dopants than the island region, the lower layer conformed to spread an electrical field, created when the power diode is operated under reverse bias, away from the island region and toward an outer boundary of the power diode; and
    the upper layer is a layer of undoped GaN.

15. The GaN power diode of claim 14 wherein the first layer of n-type GaN has a dopant concentration in excess of $10^{16}$ cm$^{-3}$ and the second layer of n-type GaN has a dopant concentration of about $5 \times 10^{15}$ cm$^{-3}$.

16. The GaN power diode of claim 14 wherein the island region of p-type GaN has a dopant concentration of about $2 \times 10^{19}$ cm$^{-3}$ and the lower layer of the junction termination extension region has a dopant concentration about 10% less than the island region.

17. The GaN power diode of claim 14 wherein the power diode further comprises
   a passivation layer disposed over an exposed surface of the junction termination extension region, providing electrical isolation for the power diode.

18. The GaN power diode of claim 13 wherein the power diode further comprises a contact region disposed between the island region and the second ohmic contact, the contact region comprising a layer of heavily-doped p-type GaN.

19. The GaN power diode of claim 18 wherein the contact region has a dopant concentration exceeding about $2\times10^{19}$ cm$^{-3}$.

20. The GaN power diode of claim 14 wherein the n-type dopant is selected from the group consisting of: Si, O, and Sn, and the p-type dopant comprises Mg.

* * * * *